US006734363B1

(12) United States Patent
Horton et al.

(10) Patent No.: US 6,734,363 B1
(45) Date of Patent: May 11, 2004

(54) LIGHTWEIGHT ELECTRONIC EQUIPMENT CONDUCTOR WITH COOLANT PERMEABLE SUPPORT

(75) Inventors: Raymond Robert Horton, Dover Plains, NY (US); Ismail Cevdet Noyan, Peekskill, NY (US); Michael Jon Palmer, Auburn, AL (US); William Edward Pence, IV, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1074 days.

(21) Appl. No.: 09/205,782

(22) Filed: Dec. 4, 1998

Related U.S. Application Data

(60) Division of application No. 08/772,665, filed on Dec. 23, 1996, now Pat. No. 5,847,926, and a continuation-in-part of application No. 07/909,925, filed on Jul. 7, 1992, now abandoned.

(51) Int. Cl.[7] .............................. H01B 7/00; H01B 9/06

(52) U.S. Cl. ............................ 174/117 F; 174/117 FF; 174/15.1; 174/16.1; 174/16.2

(58) Field of Search ........................ 174/117 F, 117 FF, 174/117 R, 68.5, 15.1, 16.1, 16.2; 361/387, 382

(56) References Cited

U.S. PATENT DOCUMENTS 2,923,860 A * 2/1960 Miller ........................ 317/101
2,952,579 A * 9/1960 Merriman ................... 154/127
3,052,749 A * 9/1962 Snapp et al. ............... 174/68.5
3,083,259 A * 3/1963 Wells ........................ 174/68.5
4,408,255 A * 10/1983 Adkins ....................... 361/382
4,763,225 A 8/1988 Frenkel et al. .............. 361/388
4,783,721 A 11/1988 Yamamoto et al. ......... 361/382
4,879,632 A 11/1989 Yamamoto et al. ......... 361/386
4,920,574 A 4/1990 Yamamoto et al. ......... 361/385
5,029,638 A 7/1991 Valenzuela .................. 165/164
5,060,114 A * 10/1991 Feinberg et al. ............ 361/387

FOREIGN PATENT DOCUMENTS

EP 48488 3/1982

OTHER PUBLICATIONS

HITechmetal Engineering—FOAMETAL–, Tech. Brochure–6 Pages Published by HITec Metal Group, Cleveland, Ohio.

IBM TDB Vol 22 No. 11 Apr. 1980 p. 5905.

* cited by examiner

*Primary Examiner*—William H. Mayo, III
(74) *Attorney, Agent, or Firm*—Daniel P. Morris; Alvin J. Riddles

(57) ABSTRACT

The invention provides a wiring conductor for densely packed electronic apparatus, on which there is a supporting body of a material with randomly intertwined and fused filaments with spacing for being permeated by a coolant. The filamentary body material in addition may have imparted thereto the physical properties of interdependent density and permeability, noncorrosiveness and electrical conductivity.

11 Claims, 3 Drawing Sheets

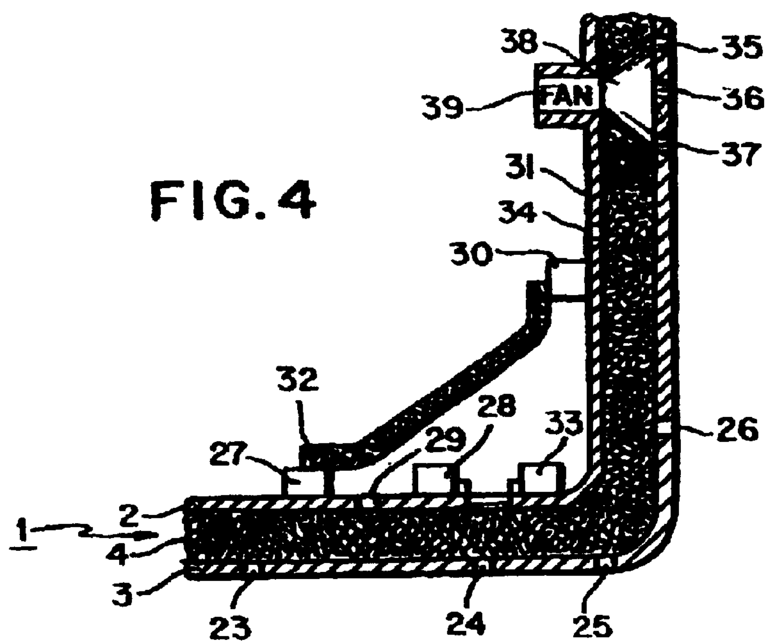
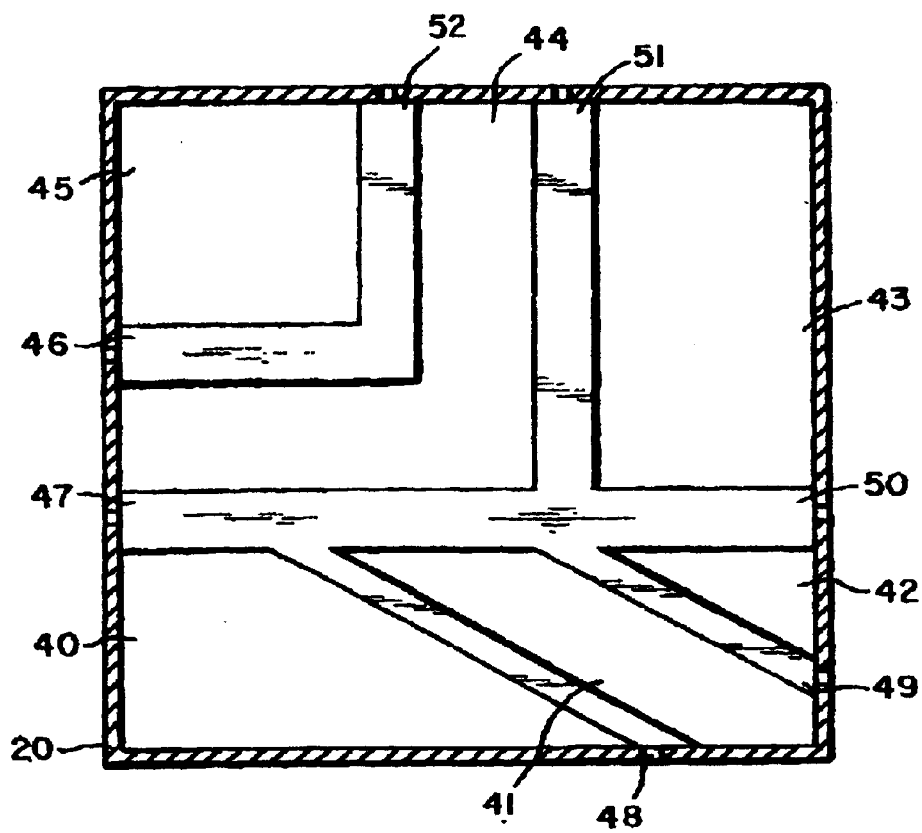
FIG. 5

LIGHTWEIGHT ELECTRONIC EQUIPMENT CONDUCTOR WITH COOLANT PERMEABLE SUPPORT

This application is a division of appn. Ser. No. 08/772,665 Filed Dec. 23, 1996, now U.S. Pat. No. 5,847,926 and a C-I-P of appn. Ser. No. 07/909,925 Filed Jul. 7, 1992, now abandoned.

FIELD OF THE INVENTION

The invention relates to the packaging of somewhat fragile equipment, such as portable electronic apparatus, and in particular to high density, lightweight, physically protective, electronic packaging with enhanced capability for cooling.

BACKGROUND OF THE INVENTION

The technology of arranging and supporting electronic components for use as a functional apparatus has come to be referred to in the art as packaging. Fragile equipment and electronic apparatus packaging generally provides a housing for the signal processing elements or devices that permits them to operate in the designed manner while still protecting them from potentially detrimental hazards encountered in conditions of use. As the equipment and the electronic apparatus becomes smaller and more portable, the density and sensitivity of the devices require greater cooling ability and physical protection while the applications in which use will take place, such as cellular phones and laptop computers require ever diminishing weight and physical volume together with increased hazard protection. Portable devices are more difficult to cool, more complex to wire; they can be placed near radiating equipment and they are subject to being dropped. The packaging must typically protect, have highly efficient cooling and having electrical shielding capability.

In cooling, heat that is locally generated at a signal processing device must be transferred to the ambient outside the structure. As device density and performance go up, the heat transfer criteria become more difficult to satisfy without there also being some transfer of heat from one closely packed device that may affect another.

The current goals in portable electronic apparatus are directed to confining the total weight of the apparatus including the housing or case to less than 4 lbs., while permitting ever denser assemblies of heat generating elements. To achieve such a low weight goal, new materials and packaging relationships will be needed.

In packaging design it is becoming very difficult to meet all the conflicting criteria with the conventional properties of materials and structures.

The Prior Art

Packaging efforts in the prior art have been principally directed toward handling such individual aspects as overall heat dissipation from the entire structure and electrical shielding.

In U.S. Pat. Nos. 4,783,721, 4,879,632 and 4,920,574 a metal bellows structure accommodates expansion differences between heat generating semiconductor chip devices and a common heat transfer fluid conduit but at the expense of the addition of significant structure.

In U.S. Pat. No. 5,029,638 the increased area property of a permeable material is employed in fins in a heat exchanger that improves conduction of the heat from the chip to the heat transfer fluid thereby reducing need to accommodate as much expansion. The progress provided by U.S. Pat. No. 5,029,638, in cooling alone, involves significant additional structure which may not be tolerable if there are other and conflicting requirements in the direction of compactness and weight.

Permeable materials, that is materials that provide additional surface area and permit liquid and gaseous coolant to flow through them, have been further employed in the art.

In European patent EP 48,488 a layered housing is employed with a material called a metal fleece for the purpose of enhancing shielding.

In European Patent EP0559092 of McLellan a metal foam is used in a semiconductor device heat sink to enhance the radiation properties of the heat sink area.

In IBM TDB Vol.22, No.11, April 1980, page 5095, a porous metal is used as a heat transfer enhancer.

In U.S. Pat. No. 4,408,255 layers of steel wool are added to metal shielding layers for cooling purposes.

SUMMARY OF THE INVENTION

The invention provides lightweight packaging of portable electronic apparatus by using the combined structural properties of an enclosure, that houses the intertwined heat producing electronic signal devices of the apparatus, to provide coolant movement and direction, locally selectable physical protection and shock resistance and electrical shielding.

It achieves the packaging benefits by having;

- a laminated enclosure member structure that has an internal device supporting lamination and an external wear resistant lamination on each side of a layer of a material that has the combined physical properties of selectably interrelated coolant permeability and density, non-corrosiveness and electrical conductivity;
- heat generating signal processing devices mounted on the internal lamination;
- positioned holes through the laminations on each side of the permeable material layer that provide entrance, exit and directing openings for a coolant fluid, including air,that is brought in from the outside, and, propelling the coolant at least convectionally, by the heat from the signal processing devices and additionally by a separate fan located in the enclosure, so that the heated coolant is exhausted to the outside.

Localized shock resistance is imparted by selective change in the density of the permeable layer.

BRIEF DESCRIPTION OF THE DRAWINGS

FIG. 2 is a microscopic view of a metal foam coolant permeable material.

FIG. 4 is a depiction of the invention illustrating the use of coolant permeable wiring and a fan type coolant propelling member.

FIG. 5 is a top view of a section of the coolant permeable material layer of the laminated enclosure element showing multiple panels of the coolant permeable layer with channels between them.

DESCRIPTION OF THE INVENTION

Figures 1, 3:
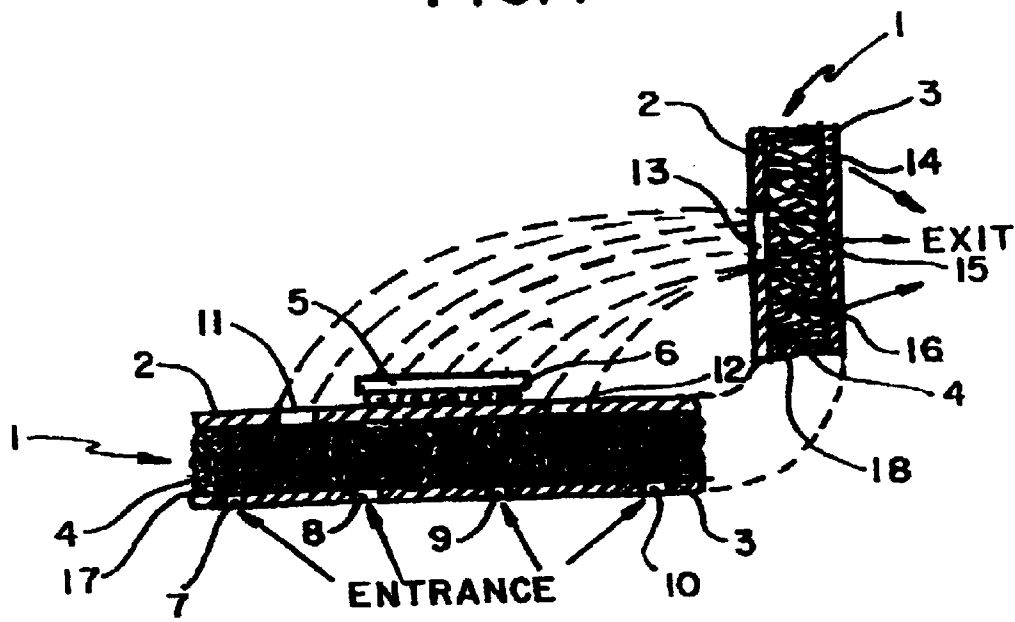
FIG. 1 is a description of the elements of the invention with an illustration of the manner of coolant flow.
FIG. 3 is a depiction of internal enclosure wiring employing a coolant permeable backing material.

In the invention an electronic equipment packaging principle is described that imparts an ability to control a coolant flow, provide physical protection and provide a component mounting support to an enclosure around the electronic equipment. The heat produced by the components of the equipment operates as a source of propulsion of the heat and becomes of major assistance in the cooling. Referring to FIG. 1 there is shown a depiction of the invention with an illustration of the manner of coolant flow that becomes available from the relationship of the elements of the structure. In FIG. 1 a laminated enclosure member 1 is provided that has a, internal to the enclosure, device supporting lamination 2, and a, external to the enclosure, wear resistant lamination 3, positioned on each side of a central layer 4 of a material that has the combined physical properties of selectably interrelated coolant permeability and density, non-corrosiveness and electrical conductivity.

Some properties may be inherent whereas others may have to be imparted. For example, the coolant permeable central layer 4 is a structure of randomly intertwined and fused filaments the density of which can be adjusted such as the foam metal material to be described in connection with FIG. 2 but when considering the further required physical property of electrical conductivity, if the material 4 were to be a metal such as foam metal electrical conductivity would be inherent whereas if the material 4 were to be other than a metal then electrical conductivity would have to be imparted as by vacuum metallization. Any metal chosen for the layer 4 should be non-corrosive such as nickel. Oxide particles from corrosion can be carried by the coolant. Steel wool would be a poor choice because of its corrosiveness.

The internal lamination 2 is a solid layer strong enough to support the heat generating signal processing devices with wiring of the electronic apparatus and is preferably insulating.

The external lamination 3 is a solid layer with wear resistant properties at least on the outside surface such as some plastics or metal. The downside of metal is that the goal is lightness of weight and metal is less likely to meet a weight specification.

Of the combined physical properties of the layer 4, the coolant permeability permits a liquid or gasseous coolant such as air to pass through it in all directions, the electrical conductivity is useful in shielding and the selectable density is useful in shock resistance and in providing a permeable support that has reduced disruption of heat flow.

In FIG. 1, an example heat generating component 5 such as an integrated circuit chip is mounted on the lamination 2 by being connected at 6 to conductors (not shown) in or on the layer 2 which is preferably an insulator. The heat generated by the component 5 is a source of convective propulsion of the coolant which is to be exhausted out of the enclosure 1.

Coolant holes 7–16 are provided in the layers 2 and 3 on each side of the permeable material 4 so as to provide entrance, through holes 7–10 and 11 and 12, and exit through hole 13 and holes 14–16. A directing function is performed by the holes 11 and 12 in taking the coolant that enters the material 4 over a broad area, through holes 7–10 and directing it to a location adjacent to the component 5, where it picks up the heat from component 5. A similar direction function can be performed by the positioning of the hole 13 to direct the flow pattern of heated coolant, shown dotted, away from other components.

In FIG. 1 the heat produced by the component 5 provides coolant propulsion through the coolant permeable layer 4 by convectively drawing cooler coolant into the enclosure 1 through the entrance holes 7–10 which displaces and propels the heated coolant out the exit holes 13–16. In lightweight electronic apparatus the use of air as the coolant and convection as a propellant is preferred. The packaging system of the invention permits much greater heat extraction.

The principle of the invention can readily be extended to the use of a fluid coolant by providing a coolant retaining jacket (not shown) around the enclosure 1 to recycle the coolant from exit to entrance.

Localized coolant flow and shock accommodation is imparted to the enclosure 1 by selective change in the density of the coolant permeable layer 4. Strength can be increased locally by increasing the density at a specific location, weight, and resistance to coolant flow can be reduced by decreasing the density and in a situation where the electronic apparatus should not receive an abrupt shock, such as by dropping, the density can be adjusted to accommodate the desired condition. This is illustrated in FIG. 1 by the section 17, supporting the component 5, being more dense than the section 18, where the exhaust is located.

Figure 2:
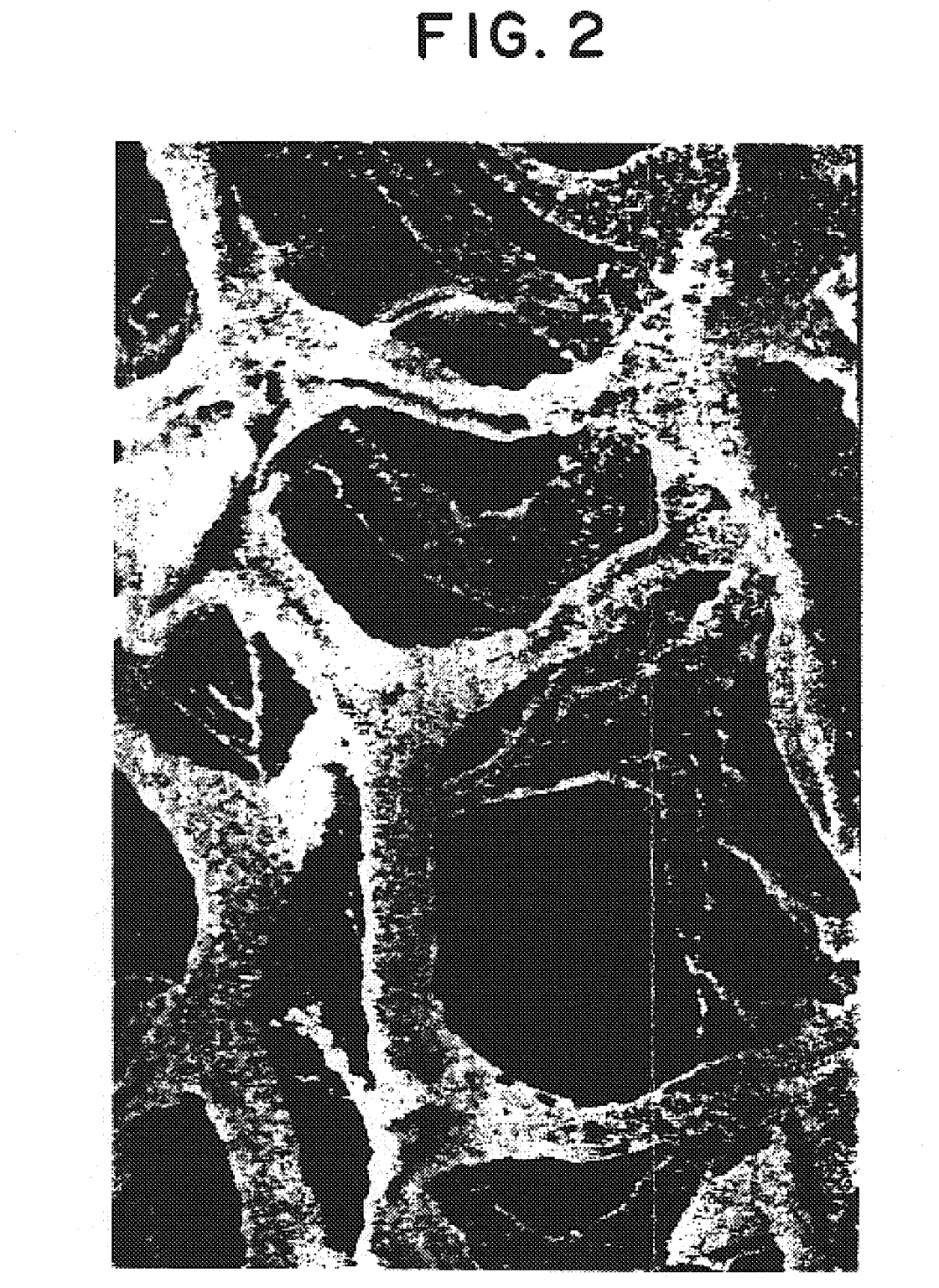

Referring to FIG. 2 there is shown a microscopic view of a metal foam coolant permeable material. The material is a random distribution of intertwined and fused filaments of a non-corrosive metal. The material is available in the art in a wide range of specifiable densities at specifiable dimensions. One manufacturer is Hogen Industries, in Mentor, Ohio, U.S.A.

The greater the permeability and the less dense the material is the more it will deform under stress and the more coolant can pass through it transferring more heat.

Referring to FIG. 3 there is shown a depiction of internal enclosure wiring employing a coolant permeable backing material 19 supporting conductors 20 separated from the conductive material 19 by conventional insulation layers 21 useable as a cabling structure.

As electronic apparatus is downsized, it may become necessary to mount signal processing members on the side and cover. Under such conditions planar wiring is not always feasible and unsupported cabling becomes necessary. Such cabling however, produces cooling problems in that there are shadow areas where the heat flow shown dotted in FIG. 1 would be disrupted by the presence of the cables. In the structure of FIG. 3 the coolant can flow through the material 19,thereby cooling any resistance produced heat or IR drop in the cable itself,and reducing flow disruption problems. Where the electrical criteria, will permit the use of the electrical conductivity of the material 19, the conductor 20 and insulator 21 may not be needed, and even greater coolant flow through the material 19 will occur. The thickness dimension of the material 19 need only be sufficient for support and the thinner it is, the more flexible it will be. The cable structure also permits of electrical characteristic impedance control by relative positioning of the conductors 20 with respect to each other and strip line impedance control of each conductor relative to the permeable backing serving as a ground plane.

Referring to FIG. 4 there is shown a depiction of the invention illustrating the use of coolant permeable wiring and a fan type coolant propulsion assistance member.

In FIG. 4, where like reference numerals are used where appropriate, the enclosure 1 is made up of an outside, wear resistant, laminate 3 of for example formic aldehyde resin, an internal laminate member 2 such as printed circuit board material, and the permeable layer 4 is of foam metal.

The portion of the enclosure 1 shown in FIG. 4 involves two sides meeting at a corner. Holes 23–26 in the outside 3, and 29 and 34 in the internal 2, laminations provide the entrance function and holes 35–37 provide the exit function together with a larger hole into which a fan 39 is positioned.

There are available in the art small fans in sizes of the order of being able to be positioned on an integrated circuit package such as 5 in FIG. 1 and into openings such as 38. Such fans can be used to assist the convection in heat transfer. Improved operation is achieved where forced flow is superimposed on an optimized convective heat flow pattern.

In FIG. 4, holes 23 and 24 are positioned to produce air flow that is horizontal under devices 27 and 28 on it's way to hole 29 so that heat radiated into and conducted into the layer 4 by the filaments is transferred into the air flowing through hole 29. Device 30 is positioned on the side portion 31 of the enclosure 1 and is electrically served by unsupported cable 32 connecting devices 27 and 30, with the cooling pattern being such that air from hole 29 passes through the cable 32. Devices 28 and 33 are connected by planar wiring. Some heat from devices 28 and 33 is radiated into the flow in the layer 4 from holes 24, 25 and 26 to hole 34, while other heat passes through cable 32 to the fan 39. In general there are two heat flow paths, one in the layer 4 under the heat generating devices mounted on the lamination 2 and the other in the air from the holes in the lamination 2 and from the heat generating devices mounted on the laminate 2 to the fan 39 with air being able to pass through any cabling such as 32 in the path.

For perspective, an example enclosure such as 1 in FIGS. 1 and 4 of the packaging system of the invention that is approximately 13 inches, by 10 inches by 1 inch would weigh approximately 350 grams which is considered to be approximately 280 grams less than the approximate weight of a solid enclosure with the same dimensions.

The capability of tailoring the density of the permeable material 4 together with the ability to provide discrete sections meeting different density criteria is useful in weight reduction, localized special heat dissipation and localized reinforcement. The permeable material 4 can be made in area quantities to specific criteria which can then be cut apart and different criteria quantities used in different locations with low drag coefficient channels between.

Referring to FIG. 5 there is shown a top view of a sections of the permeable material layer 4 of FIGS. 1 and 4. In FIG. 5 sections 40–45 are shaped portions of the material 4 for specific application purposes. Illustratively, sections 40–42 are tailored for high air flow and thus have lower density whereas sections 43–45 are tailored for higher shock resistance and thus have higher density. Between sections, channels 46–52 with holes to the outside are provided. The channels provide a low drag path for enhanced air flow and operate to reduce weight.

What has been described is the lightweight packaging of portable electronic apparatus by using the combined structural properties of an enclosure, that houses the intertwined heat producing electronic signal devices of the apparatus, to provide coolant movement and direction, locally selectable physical protection and shock resistance and electrical shielding.

What is claimed is:

1. A flexible wiring member for use in electronic apparatus, comprising in combination, a body element, said body element being of a material with randomly intertwined and fused filaments, with spacing between said fused filaments for permeation by a coolant, said body element further having first and second broad surfaces separated by a thickness dimension, and, at least one conductor element positioned on and separated from said first broad surface of said body element by an insulating layer element.

2. The wiring member of claim 1 wherein said body element is of metal foam.

3. The wiring member of claim 1 including at least two parallel conductor elements with electrical characteristic impedance positioning.

4. The wiring member of claim 3 wherein said body element is of metal foam.

5. In an electronic apparatus, a cabling member, said cabling member having at least one conductor member supported by a tape shaped body of a material having randomly intertwined and fused filaments with spacing for permeation by coolant.

6. The electronic apparatus cabling member of claim 5 wherein said at least one conductor member is separated from said tape shaped body material by an insulating member.

7. The electronic apparatus cabling member of claim 6 wherein said tape shaped body material is metal foam.

8. In the packaging of electronic apparatus the improvement comprising the supporting of at least one conductor member with a tape shaped body made of a material having randomly intertwined and fused filaments with spacing for permeation by coolant.

9. The improvement of claim 8 wherein said material of said tape shaped body is metal foam.

10. The improvement of claim 8 wherein said at least one conductor member is at least two conductor members having electrical characteristic impedance positioning.

11. The improvement of claim 10 wherein said material of said tape shaped body is metal foam.

* * * * *